United States Patent [19]
Moore et al.

[11] Patent Number: 5,194,137
[45] Date of Patent: Mar. 16, 1993

[54] SOLDER PLATE REFLOW METHOD FOR FORMING SOLDER-BUMPED TERMINALS

[75] Inventors: Kevin D. Moore, Schaumburg; John W. Stafford, St. Charles; William M. Beckenbaugh, Barrington; Ken Cholewczynski, Streamwood, all of Ill.

[73] Assignee: Motorola Inc., Schaumburg, Ill.

[21] Appl. No.: 740,272

[22] Filed: Aug. 5, 1991

[51] Int. Cl.$^5$ .......................... C25D 5/02; C25D 5/50
[52] U.S. Cl. ...................................... 205/125; 205/228
[58] Field of Search ............................... 205/125, 228

[56] References Cited

U.S. PATENT DOCUMENTS 3,871,014  3/1975  King et al. .
3,871,015  3/1975  Lin et al. .
4,545,610  10/1985 Lakritz et al. .
4,787,611  11/1989 LoVasco et al. .

OTHER PUBLICATIONS

*Metal Finishing, Guidebook and Directory* published by Metals and Plastics Publication, Inc., (1987), pp. 280, 282, 284.

Primary Examiner—T. M. Tufariello
Attorney, Agent, or Firm—Douglas D. Fekete

[57] ABSTRACT

A method for forming a solder-bumped terminal on a planar dielectric substrate utilizes a terminal of a particular configuration and comprises depositing onto the terminal a thin plate of solder alloy and reflowing the solder alloy to form a bump. The terminal configuration includes an enlarged terminal pad connected to a relatively narrow linear runner section. Preferably, the runner section width is between about 50 and 150 microns, whereas the pad width is between about 1.2 and 2.0 times the runner section width. The terminal is initially fabricated to include a metal layer adjacent the substrate formed, for example, of copper and a thin, outer plate composed of the solder alloy. The solder plate is deposited in a uniform thickness to both the terminal pad and the adjacent runner section. The terminal is then heated to melt the solder plate, whereupon the molten solder is drawn from the runner onto the enlarged pad to form a bump. In a preferred embodiment, a solder plate between about 10 and 25 microns is electrodeposited onto the terminal and reflowed to form a bump having a height between 60 and 80 microns.

19 Claims, 1 Drawing Sheet

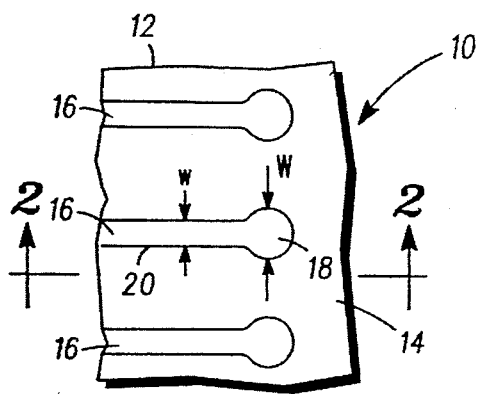
FIG.1
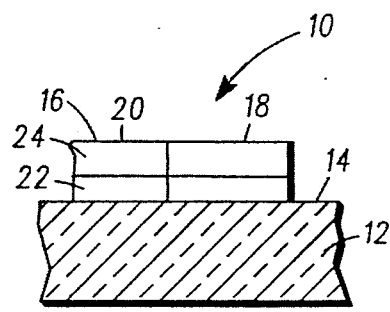
FIG.2
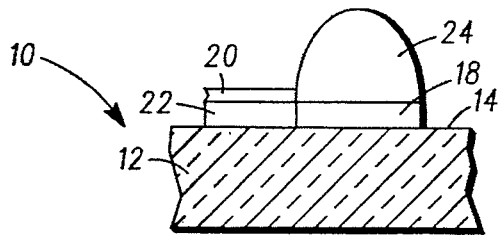
FIG.3
FIG.4
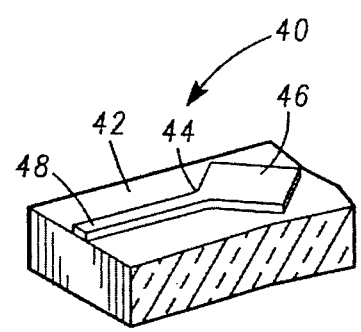
FIG.5
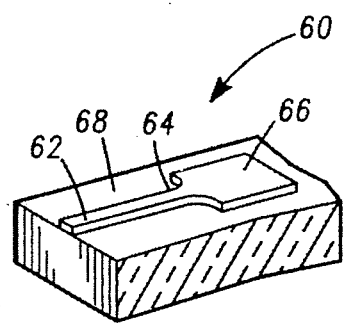
FIG.6

SOLDER PLATE REFLOW METHOD FOR FORMING SOLDER-BUMPED TERMINALS

BACKGROUND OF THE INVENTION

This invention relates to a method for forming a solder-bumped terminal on a printed circuit board or the like. More particularly, this invention relates to such method comprising reflow of a thin solder plate on a circuit trace to cause the solder to coalesce onto a terminal pad and form the desired bump.

In the manufacture of a microelectronic package, it is known to mount an integrated circuit component onto a printed circuit board by a plurality of solder bump interconnections. The board comprises a copper circuit trace disposed on a dielectric substrate and including terminal sections, each ending at a pad to which the solder interconnection is bonded. Typically, the pad has the same width as the adjacent trace and is demarked by a dam formed of a solder-nonwettable material, referred to as a solder stop, to confine the solder to the pad. The component, which may be, for example, an integrated circuit die attached to a ceramic carrier, has a plurality of solderable bond pads arranged in a pattern superposable on the terminal pads.

In preparation for mounting the component to the board, a solder bump is attached to each bond pad on the component, typically by placing a preformed microsphere of the solder on the pad and briefly heating to reflow the solder. The bumped component is assembled with the board such that each bump rests against a corresponding terminal pad on the board. The assembly is heated to concurrently reflow the several bumps onto the adjacent terminal pads to form the interconnections. During reflow, each bump is heated to melt the solder to wet the pad and resolidified, whereupon the solder becomes bonded to the terminal pad, as well as the bond pad on the component, to complete the interconnection. The interconnections not only physically join the component to the board, but also electrically connect the component to the circuit trace on the board for conducting electrical signals to and from the component for processing.

In the formation of solder bump interconnections, it is found to be advantageous to apply a solder bump to the terminal pad of the circuit trace in addition to the bump applied to the component. The solder bump may be formed on the circuit board by applying and reflowing a preformed microsphere in a manner similar to the component. However, it is more convenient to form the bumps on the board by electroplating, in part because the relatively large size of the board makes microsphere placement more cumbersome and also because the trace is available for distributing the necessary current to the several terminal pads for simultaneous plating. Processes are available for plating a thin layer of solder onto circuit traces to protect the copper surface against oxidation during manufacture of the board that would otherwise interfere with subsequent soldering of leads, for example, in the attachment of discrete components, such as resistors or capacitors. However, such thin films have not heretofore been employed in forming solder bump interconnections. This is in part because the thin film does not provide a sufficient mass for the solder bump, whereas a thick plate applied to the trace not only increases the amount of solder substantially and unnecessarily, particularly since the terminal pads constitute but a minor portion of the trace, but also because thick solder adjacent to the pad would interfere with the interconnection. Thus, a mask is needed to limit deposition to the terminal pads, which is in addition to the mask used to define the trace and which requires further processing steps to apply, develop, and remove the mask, increasing the cost of the package. In addition, the plating time needs to be extended to deposit the required thickness onto the limited area of the terminal pad. Thus, there remains a need for an improved method for forming bumps that benefits from the advantages of depositing the solder by electroplating, but does not require an additional mask and minimizes plating time while forming a bump of adequate mass for completing the solder bump interconnections.

SUMMARY OF THE INVENTION

This invention contemplates a method for forming a solder bumped terminal that includes fabricating a terminal of a particular configuration, depositing a thin plate of solder alloy and reflowing the solder to form a bump. The terminal is configured to include an enlarged pad connected to a linear runner section that has a predetermined width. The width of the runner is suitably less than 500 microns and preferably between 50 and 150 microns. The enlarged pad has a width, measured parallel to the runner width, that is greater than the runner width. A pad width greater than 1.2 times the runner width is generally effective to cause the solder to reflow into a suitable bump. Preferably, the pad width is between about 1.2 and 2.0 times the runner width. The terminal is composed of a solder-wettable metal, typically copper. Prior to reflow, the terminal also comprises a thin, outer plate composed of the solder alloy and having a uniform thickness. The solder plate is applied to both the terminal pad and the adjacent runner section. Thereafter, when the terminal is then heated to melt the solder layer, it is surprisingly found that the molten solder is drawn from the runner section onto the enlarged pad to form a bump. In a preferred embodiment, the solder layer is deposited by elctroplating to a thickness between about 10 and 25 microns and is reflowed to form a bump having a height greater than 40 microns and preferably between 60 and 80 microns.

In one aspect of this invention, a method is provided for manufacturing a printed circuit board that includes a plurality of terminals, each having a solder bump bonded thereto. The method includes applying a copper plate onto the dielectric substrate that not only includes the desired trace, but extends to an adjacent region about the trace. A photolithographic mask or the like is applied to the plate to cover the adjacent region and define an opening that exposes the copper at the trace. The masked copper plate is immersed in an electroplating bath containing dissolved tin and lead ions and cathodically biased to codeposit tin and lead metal onto the exposed copper to form the thin solder plate. Thereafter, the mask is removed to expose the adjacent copper region. The plate with the solder-plated trace is immersed in a copper etching solution. The solder coating protects the underlying trace copper, while the solution etches the exposed copper from the adjacent region to define the trace. The trace is then heated, preferably by hot oil immersion, to reflow the solder plate to form bumps on the terminal pads.

Thus, this invention provides a convenient method for concurrently forming a plurality of solder bumps on a printed circuit board. The solder for the several terminals is deposited by electroplating in a single step to produce a uniform composition and thickness. Only a thin solder plate is deposited, thereby reducing the plating time. In still another advantage of this invention, a solder plate is employed as an etch mask prior to reflow, allowing the trace to be defined and the solder deposited using only the single photolithographic mask needed for the trace, the design of which is readily modified to pattern the desired terminal configurations. Even though the solder is deposited as a thin plate, when the trace is subsequently heated to melt the solder alloy, the molten solder is nevertheless drawn onto the terminal pad to coalesce into a bump of sufficient mass for use attaching a component by solder bump interconnections.

DESCRIPTION OF THE DRAWINGS

The present invention will be further illustrated with reference to the accompanying drawings wherein:

FIG. 1 is a plan view of a printed circuit board showing terminals for forming solder bumps thereon in accordance with this invention;

FIG. 2 is a cross-sectional view of the printed circuit board in FIG. 1, taken along line 2—2, showing a terminal prior to solder reflow;

FIG. 3 is a cross-sectional view of the terminal in FIG. 2 following reflow of the solder alloy to form a bump;

FIG. 4 is an electron photomicrograph showing a solder bump formed on a printed circuit board in accordance with this invention;

FIG. 5 is a perspective view of a terminal on a printed circuit board having an alternate configuration suitable for forming a solder bump in accordance with this invention; and FIG. 6 is a perspective view of a terminal on a printed circuit board showing still another configuration suitable for forming a solder bump in accordance with this invention.

DETAILED DESCRIPTION OF THE INVENTION

In a preferred embodiment, referring to FIGS. 1-3, the method of this invention is employed to form a printed circuit board 10 having a plurality of solder-bumped terminals for mounting an integrated circuit die component by solder bump interconnections. Printed circuit board 10 comprises a dielectric substrate 12 of the type referred to as an FR4 card and composed of an epoxy resin and glass fiber laminate. Board 10 further includes a plurality of terminal sections 16 affixed to a planar surface of substrate 12 and surrounded by an adjacent bare region 14. For purposes of clarity, only a minor portion of board 10 is shown that includes the terminal sections 16, it being understood that the depicted area forms but a minor proportion of the total board and that the terminals 16 constitute a portion of a circuit trace that extends onto remote areas of the board for conducting electrical signals to and from a subsequently attached component for processing. In accordance with this invention, each terminal section 16 comprises an enlarged circular terminal pad 18 connected to a linear runner section 20. Runner section 20 extends radially from the circular pad 18 and has a generally uniform width w of about 100 microns. Terminal pad 18 has a diameter W of about 150 microns.

Referring to FIG. 2, in accordance with the method of this invention, each terminal section 16 is initially fabricated comprising two coextensive metal layers 22 and 23. Layer 22 lies immediately adjacent substrate 12 and is formed of metallic copper having high electrical conductivity conducive to conducting electrical signals. Copper layer 22 is coated by thin layer 23 composed of electroplated tin-lead solder alloy.

Printed circuit board 10 is manufactured by patterning a copper plate to define the trace, including the terminals, and electroplating solder onto the trace. Thus, a copper plate is initially applied to dielectric substrate 12 that includes trace layer 22 and also a region overlying surface region 14 about the intended trace. A suitable copper-plated board is readily commercially available and features a copper plate having a thickness of about 17 microns. A film of photoimagable polymer material is applied to the copper plate and selectively irradiated and developed to form a photoresist mask having openings for selectively exposing the copper plate in a pattern corresponding to the trace including terminals 16. The photoresist mask is about 25 microns thick and forms an electrically insulative coating on the region of the copper plate overlying region 14.

The masked board is immersed in a tin-lead plating solution and cathodically biased to deposit solder alloy onto the exposed copper trace. A suitable plating bath comprises, in water, 56.3 grams per liter tin, added as concentrated stannous fluoborate solution; 26.3 grams per liter lead, added as concentrated lead fluoborate solution, 99.8 grams per liter fluoboric acid; 26.3 grams per liter boric acid and 19.5 grams per liter liquid peptone. The masked board is immersed in the bath at ambient temperature spaced apart from a tin-lead counterelectrode. An electrical potential is applied to the copper plate to negatively bias the copper relative to the counterelectrode and codeposit metallic tin and metallic lead onto the exposed copper surface. One advantage of plating the tin-lead deposit onto the continuous copper plate prior to creating the trace is that the continuous plate facilitates distribution of the plating current to produce a uniform electrodeposit. The resulting plate is composed of about 40 percent lead and the balance tin and has a thickness of about 20 microns. The plate thickness is preferably less than the thickness of the surrounding mask, so that plating is confined to the opening above the trace and does not extend upon the mask surface.

Following plating, the board is immersed in an alkaline solution to strip the photoresist mask, thereby exposing the copper plate overlying region 14 and about the solder-coated trace. The board is immersed in an aqueous copper-etching solution containing ammonium persulfate, followed by a water rinse. The etching solution dissolves the exposed copper. However, the tin-lead alloy is resistant to attack by the etching solution and acts as a mask to protect the underlying copper trace. In this manner, the unwanted copper is removed from region 14 about the solder-plated trace to complete fabrication of the trace as depicted in FIG. 2 and including terminals having the desired configuration and formed of the copper layer coated with the uniform, thin solder plate.

The printed circuit board having the dual-layer trace is heated to reflow the solder to form the desired bumps on terminals 16. An organic flux composed of amine hydrochloride and amine hydrobromide in isopropyl alcohol vehicle is applied to the exposed solder surface. The board is immersed in hot polyoxyalkylene glycol bath at 250° C. for 15 seconds. It was found that during immersion the solder alloy melted and reflowed to draw solder from the linear runner section 20 and accumulate the solder on terminal pad 18, thereby forming a bump 24 shown in FIG. 3. Following reflow, a residual solder film 26 remains on runner 20, but having a thickness substantially reduced compared to the initial film.

FIG. 4 is an electron photomicrograph of a solder bump on a terminal formed in accordance with this embodiment. The height of the bump relative to the copper trace was about 60 microns. Thus, the bump was deemed to be particularly well suited for use in forming solder bump interconnections to attach an electrical component to the printed circuit board.

Therefore, this invention provides a solder reflow method for producing a solder bump on a terminal pad of a copper trace which requires but a single photoresist mask to define the trace including the terminal pad, which permits the solder to be deposited by electroplating and subsequently used as a mask during etching of the trace, which avoids use of a solder stop by creating conditions that coalesce the solder onto the pad from the adjacent section, and which reduces the plating time by depositing a relatively thin plate and reflowing to accumulate the desired mass for the bump. While not limited to any particular theory, the surprising formation of the bump during reflow is attributed to the particular configuration of the terminal that features an enlarged pad connected to a relatively narrow runner and is effective to cause the molten solder during reflow to be drawn by capillary forces onto the pad from the adjacent runner. In designing the terminal, it is desired to optimize the ratio of the runner width to the pad width to minimize the required thickness of the solder plate while coalescing sufficient solder during reflow to produce the desired bump size. As used herein, the runner width refers to the width of the runner section immediately adjacent the enlarged pad, whereas the pad width refers to the maximum dimension of the pad measured parallel to the runner width. This invention is believed to be particularly suitable for use with runners having widths less than about 500 microns, such as is commonly employed in designing circuit traces. The preferred runner width is between about 50 and 150 microns. A pad width, that is, the diameter for the described circular pad, of at least 1.2 times the adjacent runner width is effective in drawing sufficient solder to form a suitable bump. Preferably, the pad width is between about 1.2 and 2.0 times the runner width.

While in the described embodiment the terminal pad had a circular configuration, the pad may be shaped in any suitable fashion to provide an enlarged area for coalescence of the solder alloy. Referring to FIG. 5, there is shown an alternate printed circuit board 40 including an epoxy-glass substrate 42 and a terminal section 44 comprising a square pad 46 and an adjacent runner 48 that extends from a corner of the square pad. To better illustrate the terminal pad shape, the terminal section is depicted with the solder plate, but prior to reflow to form the bump and thus includes a copper trace and a thin, uniform solder layer similar to the terminal shown in FIG. 2. During reflow, solder is drawn from the runner section onto the terminal pad to produce a generally semispherical bump.

In still a further embodiment, FIG. 6 shows a printed circuit board 60 comprising an epoxy-glass substrate 62 and having a terminal 64 also suitably configured for the practice of this invention. Terminal 64 comprises a generally rectangular pad 66 and an adjacent runner section 68 that extends from a side of pad 66. The terminal is depicted in the condition following electrodeposition and prior to reflow, similar to the terminal depicted in FIG. 2, to better illustrate the pad configuration. During reflow, solder is drawn onto the terminal pad from the adjacent runner to produce the desired rounded bump.

A significant feature of this invention is the formation of the bump by reflowing an initial thin plate of the solder alloy on the trace terminal. While copper is most commonly selected for the trace metal because of its relative low cost and advantageous electrical properties including a low resistance conducive for conducting electrical signals, the terminal may be formed of any suitable metal that provides a solder-wettable surface, including, for example, nickel or gold, either applied directly onto the dielectric substrate or onto a copper or other metal base to provide an intermediate layer between the base and the solder. The solder layer may be formed of any suitable solder alloy. Typical solder alloys are formed predominantly of one or more metals selected from the group consisting of lead, tin and indium. In an alternate embodiment, a lead-base alloy containing about 5 weight percent tin is applied to a copper trace on a ceramic substrate suitable for withstanding the relatively high temperature required to reflow such solder alloy, which trace includes one or more terminals having a configuration in accordance with this invention to cause the solder to coalesce into bumps during reflow. An indium-base alloys containing about 30 percent lead is also suitable for electroplating and reflowing to form the desired bumps. Preferably, the solder is composed of a near-eutectic tin-lead alloy containing between about 35 and 45 percent lead. Although the solder is preferably deposited by electroplating, the plate may be formed by sputtering or any process suitable for applying a thin layer of the solder metal onto the trace.

The size of the bump formed during reflow is believed to be principally determined by the surface tension of the molten alloy on the pad. In general, it is desired to deposit a solder thickness adequate to provide sufficient molten alloy to maximize the bump. In the described embodiment, reflow of the thin solder plate also left a residual film on the runner. Depending upon the intended application, the residual film on the runner may be advantageous, for example, to provide a protective coating. On the other hand, for a specific terminal configuration, it may be desirable to minimize the initial solder deposit to reduce or eliminate the residual runner film. Adequate solder for optimum bump formation during reflow is generally provided by a plate having a thickness less than 25 microns, and preferably between about 10 and 25 microns. For the preferred terminal configuration featuring a circular pad diameter that is 1.5 times the adjacent runner width, bumps may be readily formed having a height measured relative to the copper trace surface of at least 40 microns, and preferably between about 60 and 80 microns, making the bumps particularly suited for solder bump interconnection purposes.

While this invention has been described in terms of certain embodiments thereof, it is not intended that it be limited to the above description but rather only to the extent set forth in the claims that follow.

The embodiments of the invention in which an exclusive property or privilege is claimed are defined as follows:

1. A method for forming a solder bumped terminal on a planar dielectric substrate comprising fabricating a terminal on the substrate, said terminal comprising a terminal pad adapted for receiving a solder bump and a linear runner section connected to the pad, said runner section having a predetermined width adjacent the pad, said terminal pad having a width parallel to the section width that is greater than the section width, said terminal comprising a solder-wettable metal layer adjacent the substrate and an outer plate composed of a solder alloy and having a uniform thickness, and heating the terminal at a temperature effective to melt the solder alloy and to draw the molten solder alloy onto the terminal pad from the adjacent runner section to form a solder bump.

2. A method in accordance with claim 1 wherein the solder-wettable metal layer is formed of copper.

3. A method in accordance with claim 1 wherein the solder alloy is formed predominantly of metal selected from the group consisting of lead, tin and indium.

4. A method for forming an electrical circuit trace having a solder-bumped terminal pad on a planar dielectric substrate, said method comprising fabricating a trace on the substrate, said trace including a dual-plate terminal portion comprising a terminal pad adapted for receiving a solder bump and a linear runner section extending from the pad, said runner section having a predetermined width less than 500 microns, said terminal pad having a width parallel to the runner section width that is at least 1.2 times greater than the runner section width, said terminal portion comprising a copper plate affixed to the substrate and an outer layer composed of tin-lead solder alloy, said copper layer having a uniform thickness, said solder layer having a uniform thickness less than 25 microns, and heating the terminal at a temperature effective to reflow the solder alloy, whereupon molten solder alloy is drawn onto the terminal pad from the adjacent trace section to form a solder bump having a height of at least 40 microns.

5. The method in accordance with claim 4 wherein the runner section width is between about 50 and 150 microns.

6. The method in accordance with claim 4 wherein the pad width is between about 1.2 and 2.0 times the runner section width.

7. The method in accordance with claim 4 wherein the terminal pad is a circular pad and the runner section extends radially from the pad.

8. The method in accordance with claim 4 wherein the terminal pad is a square pad and the runner section extends from a corner of the pad.

9. The method in accordance with claim 4 wherein the terminal pad is a rectangular pad and the runner section extends from a side of the pad.

10. The method in accordance with claim 4 wherein the solder plate is an electrodeposited plate composed of an alloy comprising between about 35 and 45 weight percent lead and the balance substantially tin.

11. The method in accordance with claim 4 wherein the solder plate has a thickness between about 10 and 25 microns and the solder bump height is between about 60 and 80 microns.

12. A method for manufacturing a printed circuit board comprising a copper circuit trace including a plurality of terminals adapted for attachment of an electronic component by solder bump interconnections, each terminal comprising an enlarged terminal pad and an adjacent linear runner section and having a solder bump bonded to the terminal pad, said method comprising applying a metallic copper plate having a uniform thickness onto a dielectric substrate, said plate including the circuit trace and an adjacent region about the trace, apply a removable mask onto the copper plate, said mask covering the adjacent plate region and having an opening exposing the copper plate in a pattern corresponding to the circuit trace including each said terminal, immersing the masked copper plate into an electroplating bath containing dissolved tin and lead ions, and cathodically biasing the plate to codeposit metallic tin and metallic lead onto the exposed copper to form an outer plate of tin-lead solder alloy, whereby said mask prevents deposition onto the adjacent plate region, removing the mask from the copper plate to expose the adjacent region, etching the copper plate to remove the adjacent copper region, whereby the solder plate protects the underlying copper from etching to define the circuit trace including said terminals having said enlarged terminal pads, and heating to reflow the electroplated solder alloy, whereupon solder alloy is drawn onto each terminal pad from the runner section to form a solder bump.

13. The method in accordance with claim 12 wherein the runner section width is between about 50 and 150 microns and the pad width is between about 1.2 and 2.0 times the runner section width.

14. The method in accordance with claim 12 wherein the terminal pad is a circular pad and the runner section extends radially from the pad.

15. The method in accordance with claim 12 wherein the terminal pad is a square pad and the runner section extends from a corner of the pad.

16. The method in accordance with claim 12 wherein the terminal pad is a rectangular pad and the runner section extends from a side of the pad.

17. The method in accordance with claim 12 wherein the solder plate is composed of an alloy comprising between about 30 and 40 weight percent lead and the balance substantially tin.

18. The method in accordance with claim 12 wherein the solder plate has a thickness between about 10 and 25 microns and the solder bump height is between about 60 and 80 microns.

19. A method for manufacturing a printed circuit board comprising a copper circuit trace including a plurality of terminals adapted for attachment of an electronic component by solder bump interconnections, each terminal comprising a circular terminal pad adapted for carrying a solder bump and an adjacent linear runner section, said method comprising affixing a metallic copper plate having a uniform thickness onto a dielectric substrate such that the copper plate includes the trace and an adjacent region about the trace, apply an electrically insulative photoresist mask onto the copper plate to cover the adjacent region, said mask having an opening for exposing the copper plate in a pattern corresponding to the circuit trace and defining each terminal such that the linear runner section has a width of between about 50 and 150 microns and the pad has a diameter between about 1.2 and 2.0 times the runner section width, immersing the masked copper plate into an aqueous electroplating bath containing dissolved tin and lead ions, and cathodically biasing the plate to reduce said ions and codeposit metallic tin and metallic lead selectively onto the exposed copper trace to produce a solder plate thereon, said plate being deposited to a thickness between about 10 and 25 microns and being composed of a solder alloy consisting of between about 35 and 45 weight percent lead and the balance tin, removing the mask to expose the adjacent copper region about the solder-plated trace, immersing the copper plate including the solder-plated trace in an etching solution effective to dissolve copper but not reactable with the solder alloy, whereby copper is etched from the adjacent region and protected at the trace by said solder plate to thereby define the trace, said trace including said terminals and having said solder plate overlying said copper plate, and heating the solder-plated trace to reflow the electroplated solder alloy, whereupon solder alloy is drawn onto each terminal pad from the neighboring runner section to form a solder bump having a height between about 60 and 80 microns. e

* * * * *